United States Patent
Nakayama et al.

(10) Patent No.: US 8,378,437 B2
(45) Date of Patent: Feb. 19, 2013

(54) MAGNETORESISTIVE EFFECT ELEMENT AND MAGNETIC RANDOM ACCESS MEMORY

(75) Inventors: Masahiko Nakayama, Yokohama (JP); Kay Yakushiji, Tsukuba (JP); Sumio Ikegawa, Musashino (JP); Shinji Yuasa, Tsukuba (JP); Tadashi Kai, Tokyo (JP); Toshihiko Nagase, Sagamihara (JP); Minoru Amano, Sagamihara (JP); Hisanori Aikawa, Yokohama (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 554 days.

(21) Appl. No.: 12/248,484

(22) Filed: Oct. 9, 2008

(65) Prior Publication Data
US 2009/0224342 A1   Sep. 10, 2009

(30) Foreign Application Priority Data
Oct. 12, 2007   (JP) .................................. 2007-267238

(51) Int. Cl.
*H01L 29/82* (2006.01)
(52) U.S. Cl. .......... 257/421; 257/E29.323; 257/E43.005
(58) Field of Classification Search ................. 257/421, 257/E29.323, E43.005
See application file for complete search history.

(56) References Cited

U.S. PATENT DOCUMENTS

| 5,452,163 | A  | * | 9/1995  | Coffey et al. ................ 360/324 |
| 7,105,372 | B2 | * | 9/2006  | Min et al. ........................ 438/48 |
| 2009/0152657 | A1 | * | 6/2009 | Suh et al. ...................... 257/421 |
| 2010/0270633 | A1 | * | 10/2010 | Takenaga et al. ............. 257/421 |

FOREIGN PATENT DOCUMENTS

| JP | 2002-261352 | 9/2002 |
| JP | 2007-142364 | 6/2007 |
| JP | 2007-266498 | 10/2007 |

* cited by examiner

*Primary Examiner* — Allan R Wilson
(74) *Attorney, Agent, or Firm* — Oblon, Spivak, McClelland, Maier & Neustadt, L.L.P.

(57) ABSTRACT

A magnetoresistive effect element includes a reference layer, a recording layer, and a nonmagnetic layer. The reference layer is made of a magnetic material, has an invariable magnetization which is perpendicular to a film surface. The recording layer is made of a magnetic material, has a variable magnetization which is perpendicular to the film surface. The nonmagnetic layer is arranged between the reference layer and the recording layer. A critical diameter which is determined by magnetic anisotropy, saturation magnetization, and switched connection of the recording layer and has a single-domain state as a unique stable state or a critical diameter which has a single-domain state as a unique stable state and is inverted while keeping the single-domain state in an inverting process is larger than an element diameter of the magnetoresistive effect element.

12 Claims, 8 Drawing Sheets

Single-domain state
$E=E_s$

Two-domain state
$E=E_d$

FIG. 3A Two-domain inverting process

FIG. 3B Single-domain inverting process

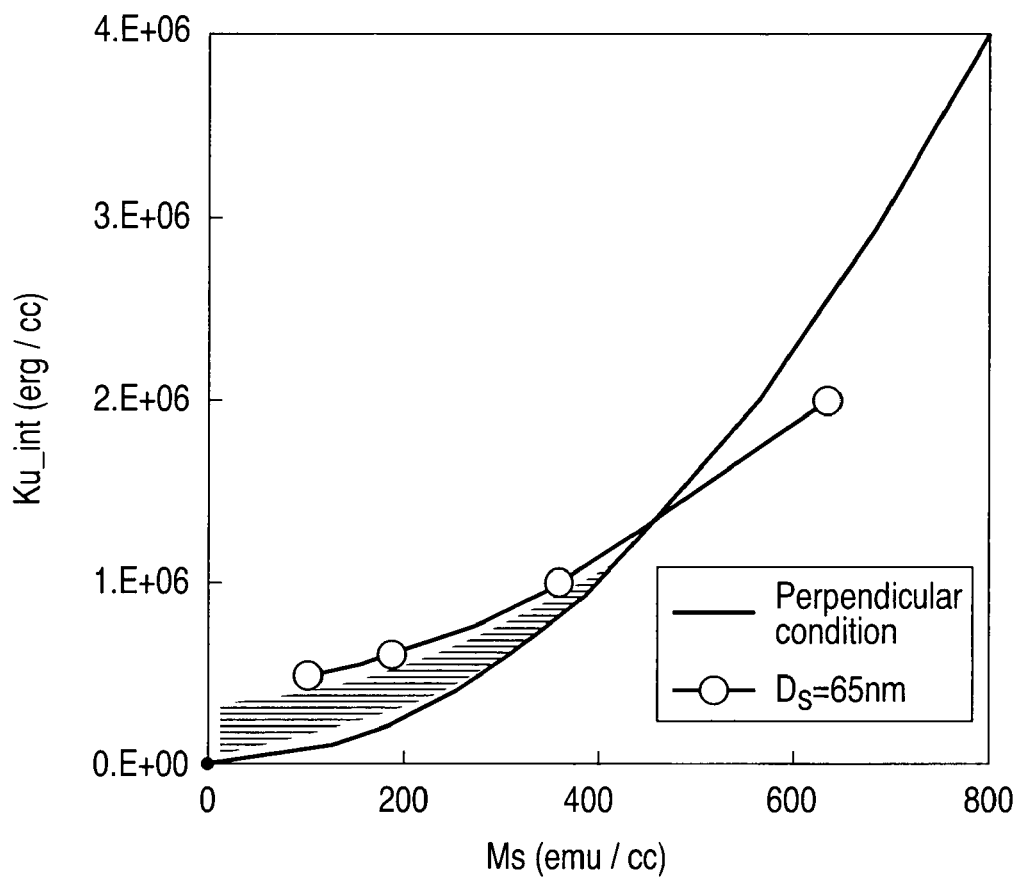
F I G. 5
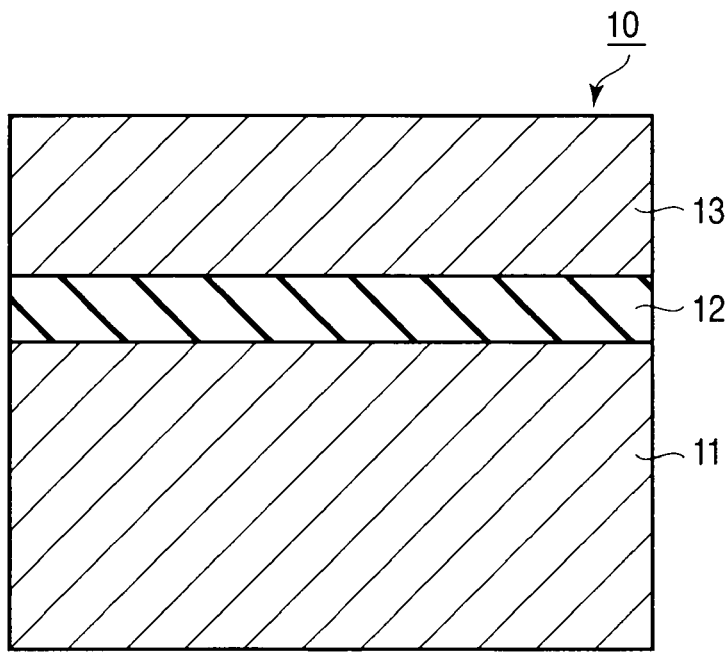
F I G. 6

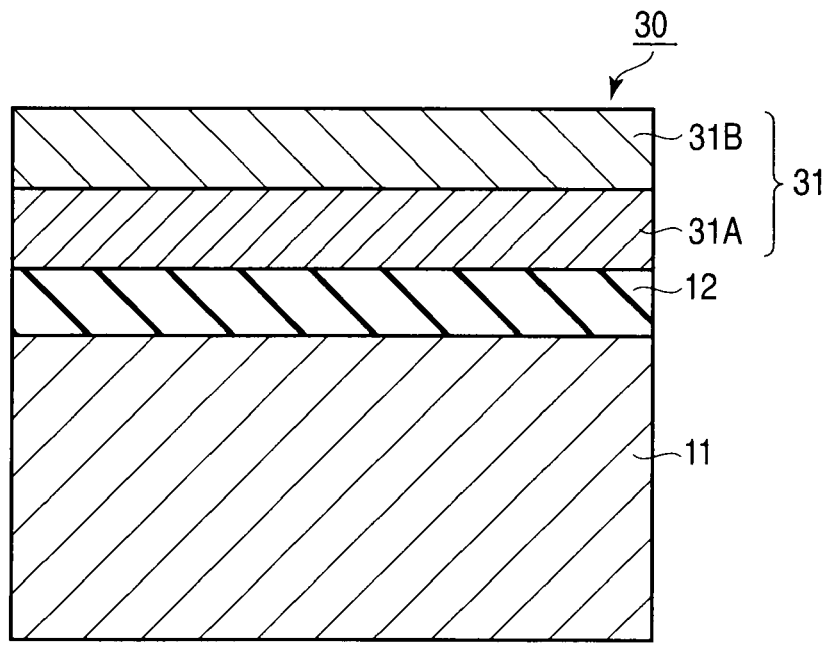
F I G. 9
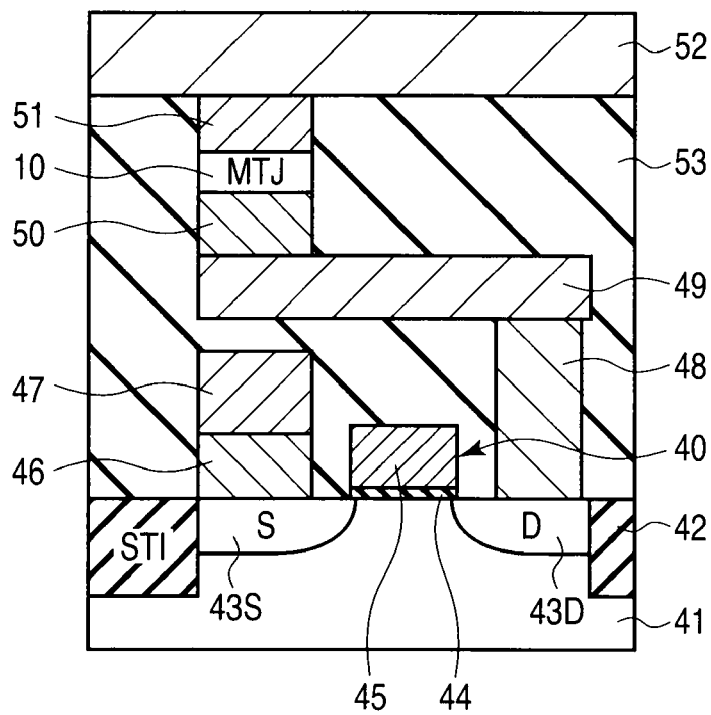
F I G. 10

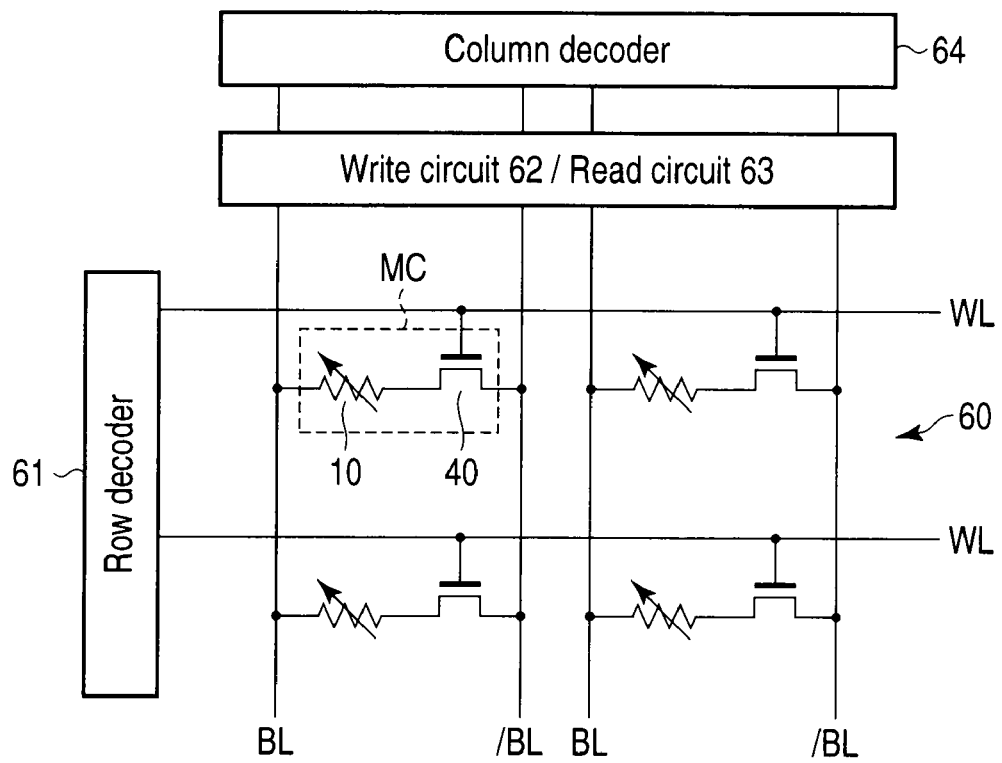
F I G. 11

MAGNETORESISTIVE EFFECT ELEMENT AND MAGNETIC RANDOM ACCESS MEMORY

CROSS-REFERENCE TO RELATED APPLICATIONS

This application is based upon and claims the benefit of priority from prior Japanese Patent Application No. 2007-267238, filed Oct. 12, 2007, the entire contents of which are incorporated herein by reference.

BACKGROUND OF THE INVENTION

1. Field of the Invention

The present invention relates to a magnetoresistive effect element and a magnetic random access memory.

2. Description of the Related Art

Conventionally, various solid-state magnetic memories are proposed. In recent years, a magnetic random access memory (MRAM: Magnetic Random Access Memory) using a magnetoresistive effect element which exhibits a giant magnetoresistive (GMR) effect has been proposed. In particular, a magnetic random access memory using a ferromagnetic tunnel junction which exhibits a tunneling magnetoresistive (TMR) effect has been attracting attention.

An MTJ (Magnetic Tunnel Junction) element of a ferromagnetic tunnel junction has a three-layer film including a first ferromagnetic layer/an insulating layer/a second ferromagnetic layer. In a read state, a tunnel current flows through the insulating layer. In this case, a junction resistance changes depending on a cosine of a relative angle between magnetizations of the first and second ferromagnetic layers. Therefore, the junction resistance is a minimum value when the magnetizations of the first and second ferromagnetic layers are parallel to each other, and is a maximum value when the magnetizations are antiparallel to each other. This is called the TMR effect. The change in resistance by the TMR effect may exceed 300% at room temperature.

In a magnetic memory device including a ferromagnetic tunnel junction as a memory cell, at least one ferromagnetic layer is regarded as a reference layer (or a fixing layer or a pin layer), a magnetization direction of the ferromagnetic layer is fixed (or invariable), the other ferromagnetic layer is regarded as a recording layer (or a magnetic recording layer, a free layer, a variable layer), and the magnetizing direction thereof is made invertible (variable). In this cell, pieces of binary information "0" and "1" are associated with the parallel and antiparallel arrangements of magnetizations of the reference layer and the recording layer to store information. In a write state of the recording information, a magnetization of a storing layer is inverted by a magnetic field generated when a current is caused to flow in a write wire arranged independently of the cell. Alternatively, the device is directly energized to invert the magnetization of the storing layer by a spin torque injected from the reference layer. The reading is performed in such a manner that a current is caused to flow in the ferromagnetic tunnel junction to detect a change in resistance by the TMR effect. A large number of the memory cells described above are arranged to configure a magnetic memory. With respect to an actual configuration, switching transistors are arranged to the cells, respectively, as in, for example, a DRAM to select an arbitrary cell, and a peripheral circuit is built therein.

As a magnetic memory device using the spin torque, an in-plane magnetization type magnetic memory device having a magnetization headed in a film surface direction is known. However, in the in-plane magnetization type magnetic memory device, when an in-plane medium using a Co—Cr-based alloy as used in a hard disk medium is used, a magnetic anisotropy in the film surface direction is largely dispersed because a crystal axis rotates. For this reason, in a large-capacity memory, the characteristics of the devices widely fluctuate, which is not desirable.

On the other hand, a magnetic memory device using a magnetic recording layer having a perpendicular magnetization has been proposed (for example, see JP-A 2002-261352 (KOKAI)). When a material having a perpendicular magnetization is used, even though crystal grains rotate in a film surface, a magnetic anisotropy in a direction perpendicular to the surface does not fluctuate because the crystal axis is perpendicular to the film surface. For this reason, by using the perpendicular magnetization type magnetoresistive element, memories the characteristics of which hardly fluctuate can be advantageously realized.

However, as a problem caused when a perpendicular magnetization film is used, the presence of a multi-domain state is given. In general, the perpendicular magnetization film has a narrow magnetic domain wall because the perpendicular magnetization film has a larger magnetic anisotropy. Since the magnetization is perpendicular to the film surface, a gain of magnetostatic energy generated by forming domains is large. Because of these properties, in the magnetoresistive effect element having a perpendicular magnetization film, a multi-domain state remains as a stable state, and an intermediate-value state or the like remains as a problem.

Furthermore, in order to realize a large-capacity memory, devices must be micropatterned, and a degree of cell occupation in a chip must be increased. However, since the thermal agitation resistance of a memory cell is determined by a magnetic anisotropy and a device volume, the thermal agitation resistance is deteriorated when the devices are micropatterned. For this reason, a sufficient record holding characteristic cannot be obtained. When the multi-domain state is present as described above, the multi-domain state becomes a metastable state, and deterioration or the like of the effective thermal agitation resistance is further conspicuous.

BRIEF SUMMARY OF THE INVENTION

According to a first aspect of the present invention, there is provided a first magnetoresistive effect element of the present invention comprises: a reference layer having an invariable magnetization which is perpendicular to a film surface;

a recording layer having a variable magnetization which is perpendicular to the film surface; and a nonmagnetic layer formed between the reference layer and the recording layer, wherein the first magnetoresistive effect element has an element diameter D that satisfies the following expressions i and ii:

$$D < \frac{24\mu_0}{M_s^2 N_a}\sqrt{AK_u} \quad \text{i}$$

$$N_a = \frac{(2D/3t)^2}{(2D/3t)^2 - 1}\left[1 - \frac{1}{\sqrt{(2D/3t)^2 - 1}}\arcsin\left(\frac{\sqrt{(2D/3t)^2 - 1}}{(2D/3t)}\right)\right] \quad \text{ii}$$

Where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient.

According to a second aspect of the present invention, there is provided a second magnetoresistive effect element of the present invention comprises: a reference layer having an invariable magnetization which is perpendicular to a film surface;

a recording layer having a variable magnetization which is perpendicular to the film surface; and a nonmagnetic layer formed between the reference layer and the recording layer, wherein the second magnetoresistive effect element has an element diameter D that satisfies the following expressions iii and iv:

$$D < \frac{6}{K_u - \frac{M_s^2}{2\mu_0}\left(N_a - \frac{1}{2}\right)}\sqrt{AK_u} \quad \text{iii}$$

$$N_a = \frac{(2D/3t)^2}{(2D/3t)^2 - 1}\left[1 - \frac{1}{\sqrt{(2D/3t)^2 - 1}}\arcsin\left(\frac{\sqrt{(2D/3t)^2 - 1}}{(2D/3t)}\right)\right] \quad \text{iv}$$

Where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient.

According to a third aspect of the present invention, there is provided a magnetic random access memory of the present invention comprises: a memory cell array including a plurality of memory cells each having the first magnetoresistive effect element as a storing element; and a current supply circuit which supplies a current to the memory cells.

According to a fourth aspect of the present invention, there is provided a magnetic random access memory of the present invention comprises: a memory cell array including a plurality of memory cells each having the second magnetoresistive effect element according to claim 6 as a storing element; and a current supply circuit which supplies a current to the memory cells.

BRIEF DESCRIPTION OF THE SEVERAL VIEWS OF THE DRAWING

FIG. 5 is a graph showing a relationship between a magnetic anisotropy energy Ku and a saturation magnetization Ms which are necessary to set a single-domain inversion critical diameter to 65 nm;

FIG. 6 is a sectional view showing a configuration in which a magnetic alloy is used as a recording layer of the magnetoresistive effect element;

FIG. 9 is a sectional view showing a configuration example using an artificial lattice structure as a recording layer of the magnetoresistive effect element;

FIG. 10 is a sectional view showing a configuration of a memory cell in an MRAM using the magnetoresistive effect element; and FIG. 11 is a circuit diagram showing a configuration of an MRAM using the magnetoresistive effect element.

DETAILED DESCRIPTION OF THE INVENTION

Figure 1A:
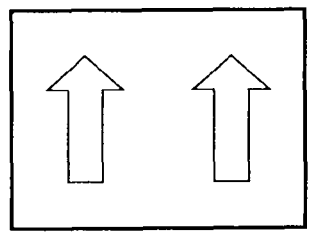
FIGS. 1A and 1B are diagrams showing magnetic domain states of a recording layer in a magnetoresistive effect element.

Embodiments will be described below with reference to the accompanying drawings. In the explanation, the same reference numerals as in all the drawings denote the same parts in the drawings.

A magnetoresistive effect element according to an embodiment of the present invention will be described below. As a characteristic feature of the embodiment of the present invention, by using a magnetic anisotropy constant Ku, a saturation magnetization Ms, an exchange stiffness coefficient A, and a film thickness t of a recording layer, a single-domain critical diameter Ds* and a single-domain inversion critical diameter Ds of the recording layer are derived, and an optimum element diameter D is determined depending on the single-domain critical diameter Ds* and the single-domain inversion critical diameter Ds. The magnetic anisotropy constant K, the saturation magnetization Ms, the exchange stiffness coefficient A, and the film thickness t are those of a material constituting the recording layer. In this case, when viewed from above the film surface, a magnetoresistive effect element including a recording layer has an almost circular shape. The element diameter D means a diameter of a magnetoresistive effect element when viewed from above the film surface, i.e., the diameter of the recording layer. In the magnetoresistive effect element (described below), a magnetization of a record holding state is basically perpendicular to the film surface.

[1] Single-Domain Critical Diameter Ds*

The single-domain critical diameter Ds* of the recording layer will be described first. In this case, the single-domain critical diameter Ds* is defined as a critical diameter that has a single-domain state as a unique stable solution in a record holding state.

Figure 1B:
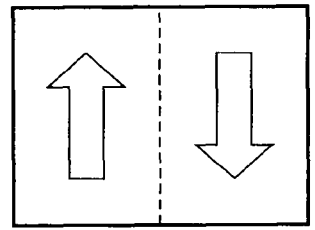

FIGS. 1A and 1B are diagrams showing magnetic domain states of a recording layer in a magnetoresistive effect element in a record holding state. In order to derive the single-domain critical diameter Ds*, a difference between an energy $E_s$ of a single-domain state (see FIG. 1A) and an energy $E_d$ of a two-domain state (see FIG. 1B) is calculated, and a critical diameter may be calculated such that the energy $E_s$ is always smaller than the energy $E_d$. In general, the energy of a magnetic material is expressed by a sum of a magnetic anisotropy energy, a magnetostatic energy, and a magnetic domain wall energy of the material. The magnetic anisotropy energy is expressed by KuV where V is a volume of the magnetic material. In the single-domain state and the two-domain state, since full magnetizations are parallel to a uniaxial anisotropy axis held by the material, the full magnetizations have the same magnetic anisotropy energy. The magnetostatic energy is expressed by a product of a demagnetization coefficient Na which reflects the shape of the magnetic material, the square of the saturation magnetization Ms, and the volume V of the magnetic material. The demagnetization coefficient Na can be analytically calculated by approximating a columnar shape of the magnetic material to a spheroid. At this time, a major-axis diameter of the spheroid used in the approximation is equal to the element diameter D, and a minor-axis diameter is expressed by (3/2)t where t is a film thickness of the magnetic material. The coefficient 3/2 of the minor-axis diameter is a correction coefficient to make the volume of the approximated spheroid equal to the volume of the columnar magnetic material. When the approximation is performed by the spheroid described above, the demagnetization coefficient of the magnetic material is expressed by the following equation 1:

$$N_a = \frac{(2D/3t)^2}{(2D/3t)^2 - 1}\left[1 - \frac{1}{\sqrt{(2D/3t)^2 - 1}} \arcsin\left(\frac{\sqrt{(2D/3t)^2 - 1}}{(2D/3t)}\right)\right] \quad 1$$

Finally, the magnetic domain wall energy is expressed by $4(AKu)^{0.5}S$ where S is an area of the magnetic domain wall, and A is a exchange stiffness coefficient. When the crystal axis is matched with the magnetization direction, a magnetic anisotropy energy KuV is 0, and the energy $E_s$ and the energy $E_d$ are expressed as follows. The energy $E_s$ in the single-domain state is expressed by only a magnetostatic energy because a magnetic domain wall is absent, and thus the energy $E_s$ is expressed by the following equation 2:

$$E_s = N_a \frac{M_s^2}{2\mu_0} V \quad 2$$

where $\mu_0$ is a vacuum magnetic permeability.

The energy $E_d$ in the two-domain state is expressed by the following equation 3:

$$E_d = \frac{N_a}{2}\frac{M_s^2}{2\mu_0} V + 4\sqrt{AK_u}\, S \quad 3$$

In the equation 3, the first term expresses a magnetostatic energy, and the second term expresses a magnetic domain wall energy. Reference symbol V denotes a volume of the element, and reference symbol S is an area of a section that is parallel to the rotating axis of the spheroid used in calculation of the demagnetization coefficient and passes through the center of the spheroid. In general, in the two-domain state, the magnetostatic energy is minimum when the volumes of the two domains are equal to each other to obtain a stable state. The reason why the first term of equation 3 is half equation 2 is that the effect of the demagnetization halves because the two domains having the equal volumes are formed.

Since the single-domain critical diameter Ds* is a diameter at which the energy $E_s$ and the energy $E_d$ are equal to each other, simultaneous equations 1 and 2 are solved to express the single-domain critical diameter Ds* as equation 4:

$$D_s^* = \frac{24\mu_0}{N_a M_s^2}\sqrt{AK_u} \quad 4$$

In the first embodiment of the present invention, the single-domain critical diameter Ds* is derived by equation 4 depending on the magnetic anisotropy constant Ku, the saturation magnetization Ms, and the exchange stiffness coefficient A of a material having a perpendicular magnetization. The magnetoresistive effect element is micropatterned to have a diameter smaller than the single-domain critical diameter Ds*, so that a perpendicular magnetization type magnetoresistive effect element which is free from an intermediate-value state can be formed.

Figure 2:
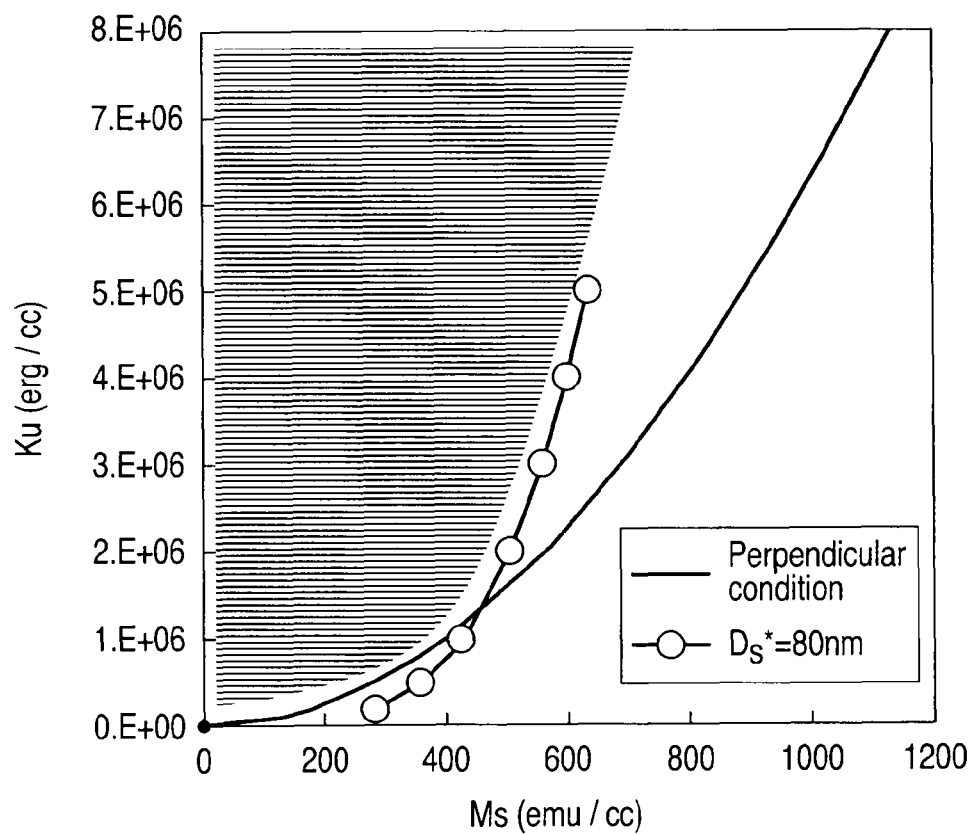
FIG. 2 is a graph showing a relationship between a magnetic anisotropy energy Ku and a saturation magnetization Ms which are necessary to set a single-domain critical diameter to 80 nm.

A second embodiment relates to a magnetoresistive effect element using a magnetic material having Ku, Ms, and A as material parameters such that the single-domain critical diameter Ds* is larger than the element diameter depending on the element diameter determined from a viewpoint such as a processing accuracy of the magnetoresistive effect element. FIG. 2 shows, as an example, the magnetic anisotropy constant Ku and the saturation magnetization Ms which are necessary to set the single-domain critical diameter Ds* to 80 nm. At this time, the calculation is performed under the condition that the exchange stiffness coefficient A is $5\times10^{-7}$ erg/cm and the film thickness t of the recording layer is 2 nm.

FIG. 2 also shows $Ku=2\pi Ms^2$ which is a perpendicular condition. This is a necessary condition to keep a magnetization perpendicular to the film surface, and the magnetic anisotropy constant Ku has to be larger than the right-hand side. As is apparent from equation 4, the magnetic anisotropy constant Ku is increased, a switched connection is increased (the exchange stiffness coefficient A is increased), or the saturation magnetization Ms is decreased, so that the single-domain critical diameter Ds* increases. On the other hand, in order to satisfy the perpendicular condition, the magnetic anisotropy constant Ku may be increased with respect to the line in FIG. 2, or the saturation magnetization Ms may be decreased with respect to the line in FIG. 2.

On the basis of these conditions, the material parameters Ku and Ms, which can keep the single-domain critical diameter Ds* at 80 nm or more while keeping a perpendicular magnetization, have to be included in a range of a hatched portion in FIG. 2. Conversely, when a magnetoresistive effect element is to be manufactured by using a material having the parameters Ku and Ms included in the hatched portion, the magnetoresistive effect element is micropatterned to have a diameter smaller than 80 nm, a single-domain state in a magnetic recording state is a unique stable solution, and it is secured that an intermediate-value state does not occur.

[2] Single-Domain Inversion Critical Diameter Ds

Figure 3:
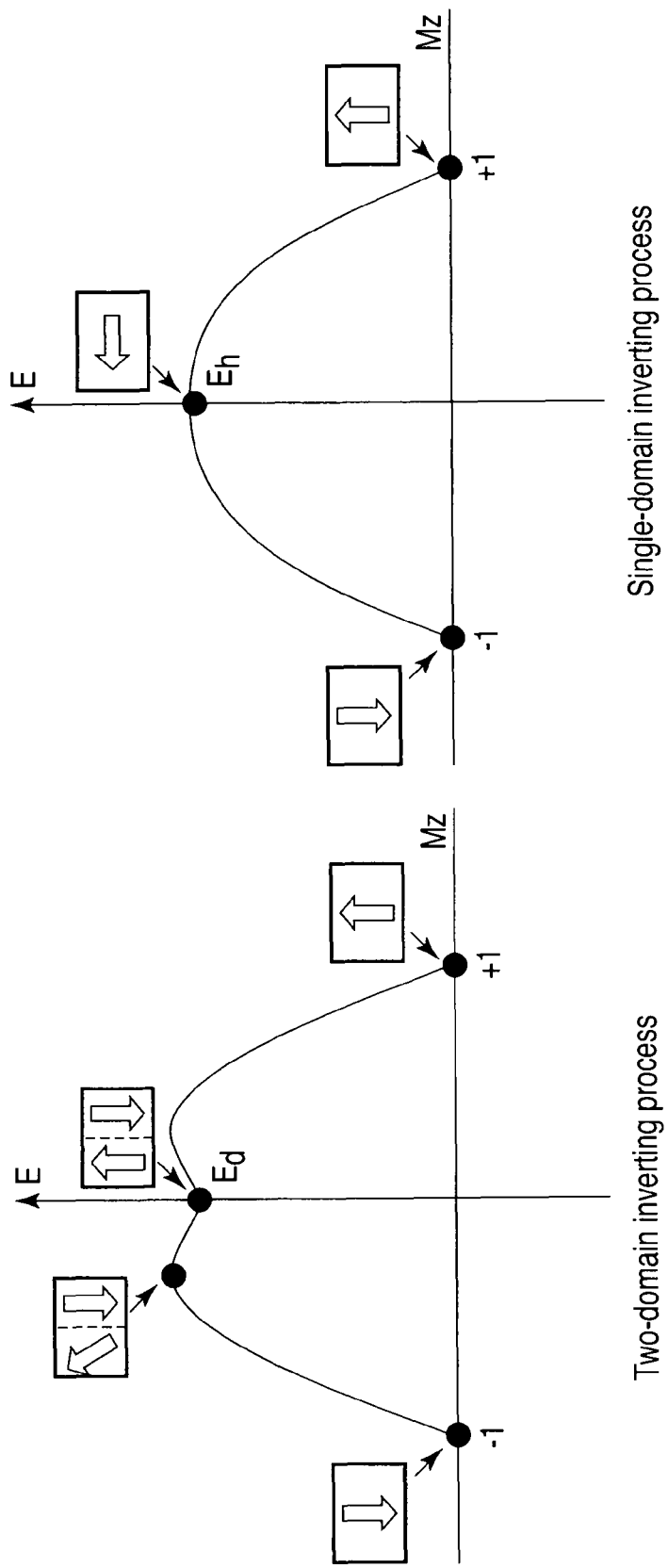
FIGS. 3A and 3B are graphs showing a magnetization direction dependency of energy in a magnetization inverting process in a two-domain state and a magnetization direction dependency of energy in a magnetization inverting process in a single-domain state.

The single-domain inversion critical diameter Ds of the recording layer will be described below. In this case, the single-domain inversion critical diameter Ds is defined as a critical diameter such that a single-domain state is a unique stable solution in the record holding state and the single-domain state is always kept even in a magnetization inverting process. FIG. 3A shows a dependency of an energy of a system on a Z-direction magnetization Mz when the two-domain state occurs in a magnetic field inverting process. The Z-direction magnetizations Mz which are −1 and +1 express pieces of recording information 0 and 1, respectively. When the two-domain state occurs in the magnetic field inverting process, the Z-direction magnetization Mz changes from −1 to +1, the maximum value of energy is obtained when one magnetic domain is tilted, and a minimum energy is obtained when the Z-direction magnetization Mz is zero. At this time, the recording layer is set in the two-domain state to have an energy $E_d$, and the two domains have directions that are antiparallel to each other, respectively.

On the other hand, FIG. 3B shows a dependency of the energy of the system on the Z-direction magnetization Mz when the single-domain state is always set in the magnetization inverting process. In the case where the Z-direction magnetization Mz changes from −1 to +1, the energy exhibits the maximum value when the Z-direction magnetization Mz is zero. At this time, the magnetization of the recording layer is set in a single-domain state, is headed in a hard-axis direction, and has an energy $E_h$. Therefore, in order to always keep the single-domain state in the magnetization inverting process, a difference between the energy $E_h$ obtained when a magnetization is headed in the hard-axis direction in the single-domain state and the energy $E_d$ in a multi-domain (two-domain) state may be calculated, and a critical diameter at which the energy $E_h$ is always smaller than the energy $E_d$ may be calculated. This is because, when the energy $E_h$ is smaller than the energy $E_d$ which is a minimum value of the energy obtained when the domains are formed, the single-domain state can be always kept even in magnetization inversion. When a spheroid model is used, the energy $E_h$ is expressed by the following equation 5 by a Stoner-Worlfarth model which describes an energy in the single-domain state:

$$E_h = K_u V + \left(\frac{1-N_a}{2}\right)\frac{M_s^2}{2\mu_0} V \qquad 5$$

In equation 5, the first term expresses the magnetic anisotropy energy obtained when a magnetization is headed in the hard-axis direction, and the second term expresses a magnetostatic energy obtained when the magnetization is headed in the hard-axis direction. The energy $E_d$ is described as described and expressed by the following equation 6.

$$E_d = \frac{N_a}{2}\frac{M_s^2}{2\mu_0} V + 4\sqrt{AK_u S} \qquad 6$$

Since the single-domain inversion critical diameter Ds is a diameter at which the energy $E_h$ is equal to the energy $E_d$, simultaneous equations 5 and 6 are solved to express the single-domain inversion critical diameter Ds as equation 7:

$$D_s = \frac{6}{K_u - \frac{M_s^2}{2\mu_0}\left(N_a - \frac{1}{2}\right)}\sqrt{AK_u} \qquad 7$$

Figure 4:
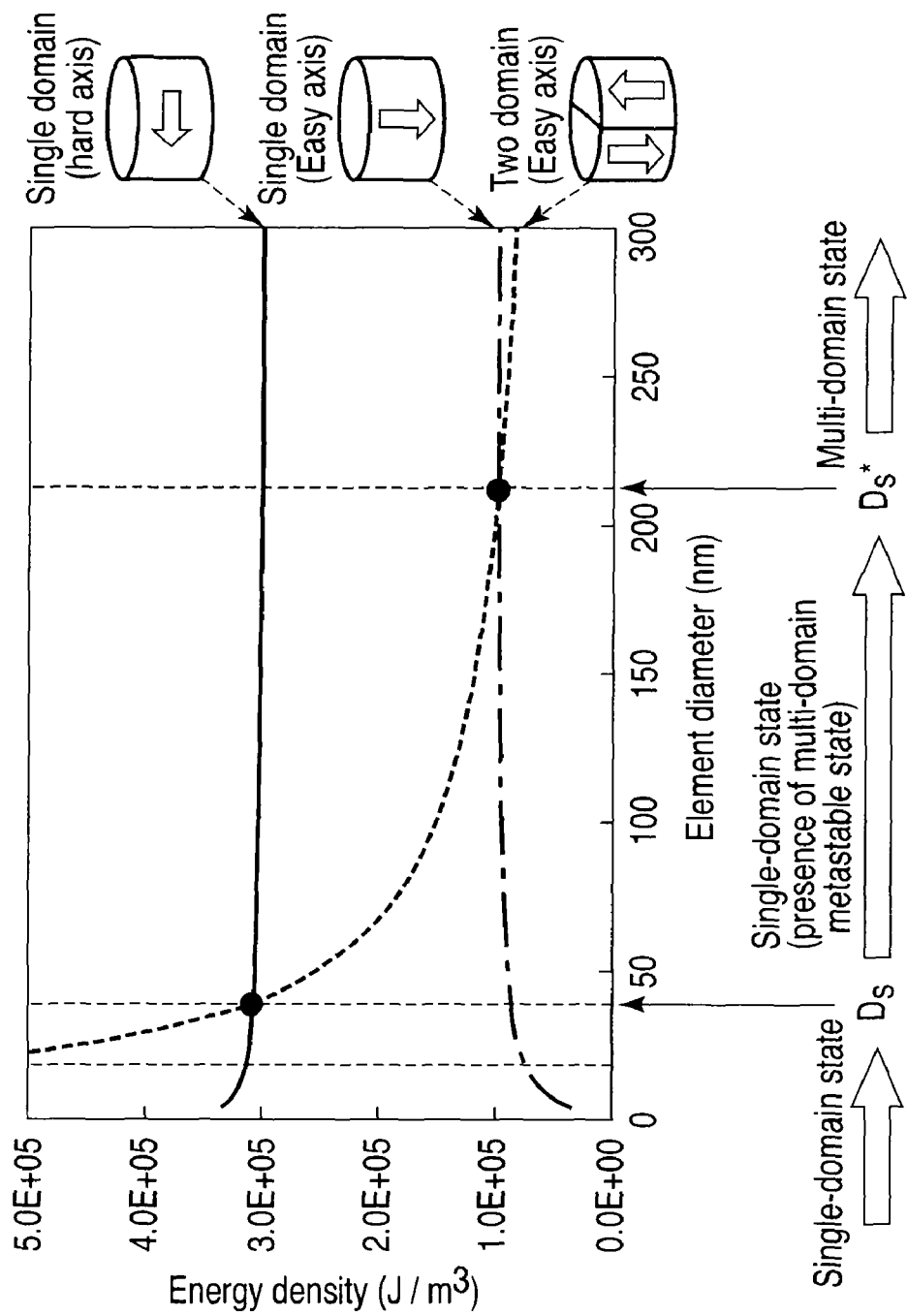
FIG. 4 is a graph showing element diameter dependencies of an energy density in a single-domain hard axis state, an energy density in a single-domain easily axis state, and an energy density in a two-domain state.

In this case, an effect of the single-domain inversion critical diameter Ds and the single-domain critical diameter Ds* given to a magnetoresistive effect element is shown in FIG. 4. FIG. 4 shows element diameter dependencies of an energy density of a single-domain hard-axis state (magnetization is parallel to the hard axis), an energy density of a single-domain easy-axis state (magnetization is parallel to the easy axis), and an energy density of the two-domain state. The energy densities are calculated by using material parameters given by magnetic anisotropy constant Ku=3×10⁶ erg/cc, saturation magnetization Ms=500 emu/cc, exchange stiffness coefficient A=1×10⁻⁶ erg/cm, and film thickness t=2 nm of the recording layer.

When the element diameter decreases, first, an energy density curve of the single-domain easy-axis state and an energy density curve of the two-domain state intersect with each other at the single-domain critical diameter Ds*, and an energy in the single-domain easy-axis state is always low at the element diameter smaller than the single-domain critical diameter Ds*. This shows that the magnetoresistive effect element having an element diameter which is smaller than the single-domain critical diameter Ds* cannot achieve a two-domain state as a stable state in a record holding state, and secures that an intermediate state is not present.

Furthermore, when the element diameter decreases, an energy density curve of the single-domain hard-axis state intersects with an energy density curve of the two-domain state at the single-domain inversion critical diameter Ds, and the energy of the single-domain hard-axis state is always smaller than the energy of the two-domain state at an element diameter smaller than the single-domain inversion critical diameter Ds. This shows that magnetization inversion is performed while always keeping the single-domain state even in the middle of the magnetization inversion when the element diameter is smaller than the single-domain inversion critical diameter Ds.

As described above, according to the Stoner-Wohlfarth model, when the single-domain state is inverted, an energy is maximum when the magnetization is headed in the hard axis, and an energy barrier is given by KuV. This energy barrier corresponds to the maximum energy barrier which is theoretically predicted when the magnetic anisotropy constant Ku is determined, and sufficient thermal agitation resistance is given to the magnetoresistive effect element. Therefore, in the magnetoresistive effect element having an element diameter smaller than the single-domain inversion critical diameter Ds, it is secured that an intermediate-value state is not present in a recording state, and that the highest thermal agitation resistance which is predicted from the material is achieved.

In a third embodiment of the present invention, a single-domain inversion critical diameter Ds is derived by equation 7 depending on a magnetic anisotropy constant Ku, a saturation magnetization Ms, and an exchange stiffness coefficient A of a material having a perpendicular magnetization, and a magnetoresistive effect element is micropatterned to have a diameter which is equal to or smaller than the single-domain inversion critical diameter Ds. In this manner, a perpendicular magnetization type magnetoresistive effect element that does not cause an intermediate-value state and has sufficient thermal agitation resistance can be formed.

A fourth embodiment relates to a magnetoresistive effect element using a magnetic material that has Ku, Ms, and A as material parameters such that a single-domain inversion critical diameter Ds is larger than an element diameter depending on the element diameter determined from a viewpoint of processing accuracy or the like of the magnetoresistive effect element.

FIG. 5 shows, as an example, the magnetic anisotropy constant Ku and the saturation magnetization Ms which are necessary to set the single-domain inversion critical diameter Ds to 65 nm. At this time, calculation is performed such that an exchange stiffness coefficient is 5×10⁻⁷ erg/cc and a film thickness t of a recording layer is 2 nm. FIG. 5 shows Ku=2πMs² which is the perpendicular condition accordingly. As is apparent from equation 7, Ku is decreased, a switched connection is increased (exchange stiffness coefficient A is increased), or Ms is increased to increase the single-domain inversion critical diameter Ds. In order to satisfy the perpendicular condition, the magnetic anisotropy constant Ku may be increased with respect to the perpendicular condition in FIG. 5, or the saturation magnetization Ms may be decreased with respect to the perpendicular condition in FIG. 5. For these conditions, while the magnetization in the perpendicular condition is kept, the material parameters Ku and Ms, which can keep the single-domain inversion critical diameter Ds at 65 nm or more, have to be included in a range of the hatched portion in FIG. 5. Conversely, when a magnetoresistive effect element is to be manufactured by using a material having the parameters Ku and Ms included in the hatched portion, the magnetoresistive effect element is micropatterned to have a diameter smaller than 65 nm, a single-domain state in a magnetic recording state is a unique stable solution, and it is secured that sufficient thermal agitation resistance is achieved without causing an intermediate-value state.

[3] Alloy Magnetic Recording Layer

FIG. 6 shows a configuration example using a magnetic alloy as a recording layer of a magnetoresistive effect element. A magnetoresistive effect element 10 includes a reference layer 11, a nonmagnetic layer 12, and a recording layer 13. The nonmagnetic layer 12 is formed on the reference layer 11, and the recording layer 13 is formed on the nonmagnetic layer 12.

In this configuration, the recording layer 13 is made of an alloy containing at least one element of Fe, Co, and Ni and at least one element of Pt and Pd and having a magnetization in a direction perpendicular to a film surface. For example, when an L10-type ordered alloy FePd is used, the magnetic anisotropy constant Ku is $2.0 \times 10^6$ erg/cc, the saturation magnetization Ms is 500 emu/cc, the exchange stiffness coefficient A is about $5 \times 10^{-7}$ erg/cm, and the film thickness t of the recording layer is 2 nm. The single-domain critical diameter Ds* and the single-domain inversion critical diameter Ds calculated by equations 4 and 7 from the material parameters are 83 nm and 42 nm, respectively, when the film thickness of the recording layer 13 is 3 nm. Therefore, when the element diameter of the magnetoresistive effect element 10 is set to less than 83 nm, the intermediate-value state can be suppressed. When the element diameter is set to less than 42 nm, the maximum thermal agitation resistance held by the material can be realized.

Even though the film thickness of the recording layer is changed, the single-domain critical diameter Ds* and the single-domain inversion critical diameter Ds are calculated by equations 4 and 7. The element diameter is set to the values or less to make it possible to manufacture an ideal magnetoresistive effect element. When the L10-type ordered alloy FePt is used, the magnetic anisotropy constant Ku is $8.0 \times 10^6$ erg/cc, the saturation magnetization Ms is 1000 emu/cc, and the exchange stiffness coefficient A is about $5 \times 10^{-7}$ erg/cm. The single-domain critical diameter Ds* and the single-domain inversion critical diameter Ds calculated by equations 4 and 7 are 44.5 nm and 18 nm, respectively, when the film thickness of the recording layer 13 is 3 nm. Therefore, when the element diameter of the magnetoresistive effect element 10 is set to less than 44.5 nm, the intermediate-value state can be suppressed. When the element diameter is set to less than 18 nm, the maximum thermal agitation resistance held by the material can be realized.

[4] Alloy Laminate Magnetic Recording Layer

Figure 7:
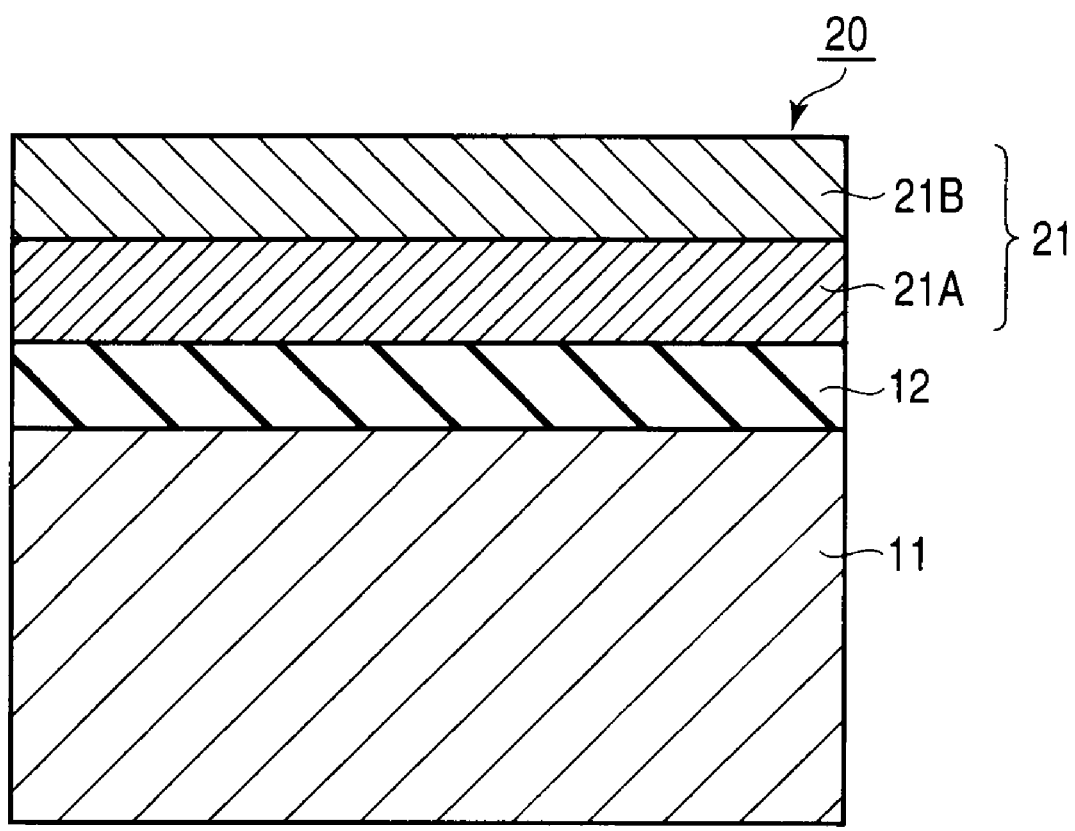
FIG. 7 is a sectional view showing a configuration example in which a laminate structure of a magnetic alloy is used as a recording layer of the magnetoresistive effect element.

FIG. 7 shows a configuration example using a magnetic alloy laminate structure as a recording layer of the magnetoresistive effect element. A magnetoresistive effect element 20 includes a reference layer 11, a nonmagnetic layer 12, and a recording layer 21. The nonmagnetic layer 12 is formed on the reference layer 11, and the recording layer 21 is formed on the nonmagnetic layer 12. The recording layer 21 is formed by a laminate structure including a magnetic layer 21A formed on the nonmagnetic layer 12 and a magnetic layer 21B formed on the magnetic layer 21A.

In this configuration, the magnetic layer 21B is made of an alloy containing at least one element of Fe, Co, and Ni and at least one element of Pt and Pd and having a magnetization in a direction perpendicular to a film surface. The magnetic layer 21A is made of an alloy containing at least one of Fe, Co, Ni, and B. For example, when an L10-type ordered alloy FePd or FePt is used as the magnetic layer 21B in FIG. 7, and when a CoFeB alloy or Fe is used as the magnetic layer 21A, the magnetic anisotropy constant Ku is about $1.8 \times 10^6$ erg/cc, the saturation magnetization Ms is 500 emu/cc, and the exchange stiffness coefficient A is about $5 \times 10^{-7}$ erg/cm. The single-domain critical diameter Ds* and the single-domain inversion critical diameter Ds calculated by equations 4 and 7 are 79 nm and 46 nm, respectively, when the sum of the film thicknesses of the magnetic layer 21A and the magnetic layer 21B is 3 nm. Therefore, when the element diameter of the magnetoresistive effect element 20 is set to less than 79 nm, the intermediate-value state can be suppressed. When the element diameter is set to less than 46 nm, the maximum thermal agitation resistance held by the material can be realized.

Figure 8B:
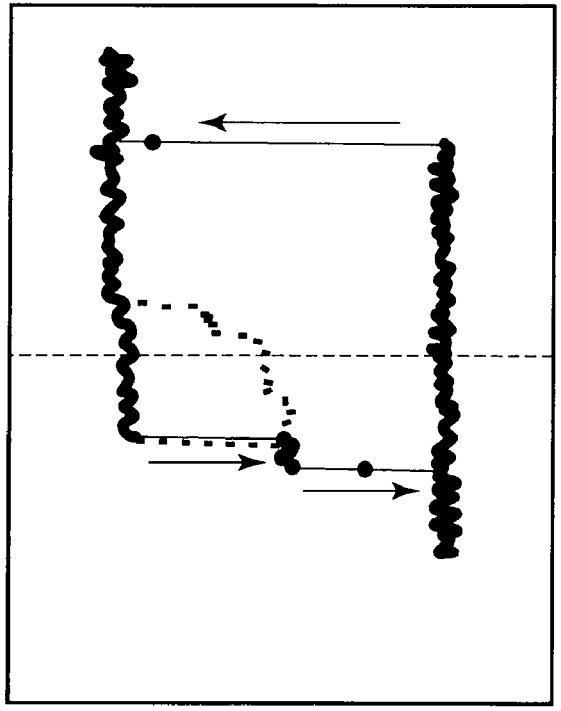
FIGS. 8A and 8B are graphs showing magnetic field dependencies of resistances of elements experimentally manufactured by using a laminate structure of a magnetic alloy as a recording layer of a magnetoresistive effect element.
Figure 8A:
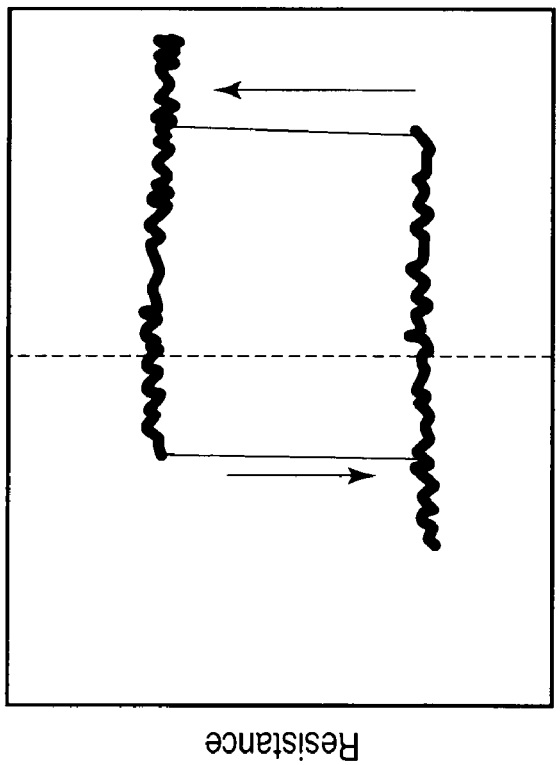

FIGS. 8A and 8B show magnetic field dependencies of resistances when a magnetoresistive effect element using an FePt alloy as the magnetic layer 21B and Fe as the magnetic layer 21A is experimentally manufactured. FIG. 8A shows the magnetoresistive effect element having an element diameter of 60 nm, and FIG. 8B shows the magnetoresistive effect element having an element diameter of 95 nm. When the element diameter is 60 nm, a magnetic field is applied in a negative direction in a high-resistance state (antiparallel magnetization state) to change the high-resistance state into a low-resistance state (parallel magnetization state). Thereafter, when a magnetic field is applied in a positive direction, the state is changed into the high-resistance state again. The changes in resistance are very sharp. The element diameter of 60 nm shows that unique stable states of two types, i.e., the parallel state and the antiparallel state are present.

On the other hand, when the element diameter is 95 nm, as shown in FIG. 8B, a stepwise change in resistance appears when a magnetic field is applied in a negative direction to set a low-resistance state. A dotted line in FIG. 8B shows a magnetic field dependency of a resistance when the magnetic field is applied in the negative direction, the application of the magnetic field is temporarily stopped at a magnetic field representing the step, and the magnetic field is applied in the positive direction again. At this time, a stable area is present at an almost intermediate value between a high-resistance state (antiparallel magnetization state) and a low-resistance state (parallel magnetization state). The resistance is just set in the high-resistance state and the low-resistance state. This shows that, when the element diameter is 95 nm, a two-domain state is present as a stable state. As described above, the single-domain critical diameter Ds* in this system is 79 nm. When the element diameter is 60 nm, the unique single-domain state is a stable state because the element diameter is equal to or smaller than the single-domain critical diameter Ds*. When the element diameter is 95 nm, it is experimentally proved that the two-domain state is present as a stable state because the element diameter is equal to or larger than the single-domain critical diameter Ds*.

Even though the film thicknesses of the magnetic layer 21A and the magnetic layer 21B are changed, the single-domain critical diameter Ds* and the single-domain inversion critical diameter Ds are calculated by equations 4 and 7. The element diameters are set to the values or less to make it possible to manufacture an ideal magnetoresistive effect element.

[5] Artificial Lattice Magnetic Recording Layer

FIG. 9 shows a configuration example using an artificial lattice structure as a recording layer of a magnetoresistive effect element. A magnetoresistive effect element 30 includes a reference layer 11, a nonmagnetic layer 12, and a recording layer 31. The nonmagnetic layer 12 is formed on the reference layer 11, and the recording layer 31 is formed on the nonmagnetic layer 12. The recording layer 31 is formed by a laminate structure including an alloy layer 31A formed on the nonmagnetic layer 12 and an alloy layer 31B formed on the alloy layer 31A.

In this configuration, the recording layer 31 has a structure in which the alloy layer (magnetic material layer) 31A containing at least one element of Fe, Co, and Ni and the alloy layer (nonmagnetic material layer) 31B containing at least one of Pt, Pd, Ir, Rh, Ru, Os, Re, Au, and Cu are alternately laminated at least once, and has a magnetization in a direction perpendicular to a film surface. At this time, a film thickness ratio of the alloy layer 31A to the alloy layer 31B is adjusted to make it possible to adjust a magnetic energy density and a saturation magnetization. However, a general magnetic anisotropy constant Ku is about $1.8 \times 10^6$ erg/cc, a saturation magnetization Ms is 400 emu/cc, and an exchange stiffness coefficient A is about $5 \times 10^{-7}$ erg/cm. The single-domain critical diameter Ds* calculated by equations 4 and 7 from the material parameters is 118 nm, and the single-domain inversion critical diameter Ds is 38 nm. Therefore, when the element diameter of the magnetoresistive effect element 30 is set to 118 nm or less, an intermediate-value state can be suppressed. From the viewpoint of thermal agitation resistance, the element diameter is preferably set to be smaller than 38 nm. More specifically, when the element diameter is smaller than 38 nm, the maximum thermal agitation resistance held by the material can be realized. The alloy layer 31A can further contain B. For example, an alloy or the like containing Co, Fe, and B can be used.

[6] Magnetic Random Access Memory

A magnetic random access memory (MRAM: magnetoresistive random access memory) using a magnetoresistive effect element according to the embodiment of the present invention will be described below. In this case, a spin transfer torque writing type MRAM using the magnetoresistive effect element 10 (or 20 or 30) according to the embodiment will be described below.

FIG. 10 is a sectional view showing a configuration of a memory cell in the MRAM according to the embodiment of the present invention. The memory cell includes the magnetoresistive effect element (MTJ element) 10 and a selection transistor 40. As shown in FIG. 10, in a surface region of a p-type semiconductor substrate 41, an element isolation insulating layer 42 is formed, and a surface region of the p-type semiconductor substrate 41 on which the element isolation insulating layer 42 is not formed serves as an element region (active area) in which an element is formed. The element isolation insulating layer 42 is formed by, for example, STI (Shallow Trench Isolation). As the STI, for example, a silicon oxide is used.

In the element region of the p-type semiconductor substrate 41, a source region 43S and a drain region 43D are formed to be separated from each other. The source region 43S and the drain region 43D are constituted by high-concentration $N^+$-type diffusion regions formed by implanting an N-type impurity into the p-type semiconductor substrates 41. A gate insulating film 44 is formed on the p-type semiconductor substrate 41 between the source region 43S and the drain region 43D. On the gate insulating film 44, a gate electrode 45 is formed. The gate electrode 45 functions as a word line WL. In this manner, the selection transistor 40 is arranged on the p-type semiconductor substrate 41.

On the source region 43S, a wiring layer 47 is formed through a contact 46. The wiring layer 47 functions as a bit line /BL. On the drain region 43D, an outgoing line 49 is formed through a contact 48.

On the outgoing line 49, the MTJ element 10 sandwiched by a lower electrode 50 and an upper electrode 51 is arranged. A wiring layer 52 is formed on the upper electrode 51. The wiring layer 52 functions as a bit line BL. An insulating interlayer 53 made of, for example, a silicon oxide is filled between the p-type semiconductor substrate 41 and the wiring layer 52.

A circuit configuration and an operation of an MRAM according to the embodiment of the present invention will be described below.

FIG. 11 is a circuit diagram showing a configuration of the MRAM according to the embodiment of the present invention. The MRAM includes a memory cell array 60 having a plurality of memory cells MC arranged in the form of a matrix. In the memory cell array 60, a plurality of pairs of bit lines BL and /BL are arranged in a column direction. In the memory cell array 60, a plurality of word lines WL are arranged in a row direction.

Each of the memory cells MC is arranged at an intersection between the bit line BL and the word line WL. Each of the memory cells MC includes the MTJ element 10 and the selection transistor 40 constituted by, for example, an n-channel MOS transistor. One end of the MTJ element 10 is connected to the bit line BL. The other end of the MTJ element 10 is connected to the drain of the selection transistor 40. The gate of the selection transistor 40 is connected to the word line WL. Furthermore, the source of the selection transistor 40 is connected to the bit line /BL.

A row decoder 61 is connected to the word line WL. A write circuit 62 and a read circuit 63 serving as current supply circuits are connected to the pair of bit lines BL and /BL. A column decoder 64 is connected to the write circuit 62 and the read circuit 63. Each of the memory cells MC is selected by the row decoder 61 and the column decoder 64.

Data is written in the memory cell MC in the following manner. In order to select the memory cell MC in which data is written, the word line WL connected to the memory cell MC is activated. In this manner, the selection transistor 40 is turned on.

In this case, an interactive write current Iw is supplied to the MTJ element 10 depending on write data. More specifically, when the write current Iw is supplied from the bit line BL to the bit line /BL to supply the write current Iw to the MTJ element 10, the write circuit 62 applies a positive voltage to the bit line BL and applies a ground voltage to the bit line /BL. When the write current Iw is supplied from the bit line /BL to the bit line BL to supply the write current Iw to the MTJ element 10, the write circuit 62 applies a positive voltage to the bit line /BL and applies a ground voltage to the bit line BL. In this manner, data "0" or data "1" can be written in the memory cell MC.

Data read from the memory cell MC is performed as follows. The selection transistor 40 of the selected memory cell MC is turned on. The read circuit 63 supplies a read current Ir from the bit line /BL to the bit line BL to supply the read current Ir to the MTJ element 10. The read circuit 63 detects a resistance of the MTJ element 10 on the basis of the read current Ir. In this manner, data stored in the MTJ element 10 can be read from the detected resistance of the MTJ element 10. The case using the MTJ element 10 has been described above. However, the configuration and the operation obtained when the magnetoresistive effect element 20 or 30 is used are the same as described above.

In each of the embodiments described above, in the magnetoresistive effect element, the recording layer is formed on the upper side of the reference layer. However, the reference layer may be formed on the upper side of the recording layer. More specifically, the reference layer and the recording layer may be vertically reversed.

As described above, according to the embodiments of the present invention, a magnetoresistive effect element that can improve thermal agitation resistance and can suppress occurrence of an intermediate-value state and a magnetic random access memory using the magnetoresistive effect element can be provided. Even though the memory cell is micropatterned, a magnetoresistive effect element that can keep high thermal agitation resistance of bit information and can realize a large capacity and a magnetic random access memory using the magnetoresistive effect element can be provided.

The embodiments described above can be independently executed, or can be executed by being combined with each other. The embodiments described above include inventions in various phases. The inventions in the various phases can also be extracted by an arbitrary combination of the plurality of constituent elements disclosed in the embodiments described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element comprising:
a reference layer having an invariable magnetization which is perpendicular to a top surface of the reference layer;
a recording layer having a variable magnetization which is perpendicular to the top surface of the reference layer;
the top surface of the recording layer is parallel to the top surface of the reference layer; and
a nonmagnetic layer formed between the reference layer and the recording layer,
wherein the recording layer is made of a magnetic alloy containing at least one element of Fe, Co, and Ni and at least one element of Pt and Pd, and
the magnetoresistive effect element has an element diameter D that satisfies the following expressions i and ii:

$$D < \frac{24\mu_0}{M_s^2 N_a} \sqrt{AK_u} \qquad \text{i}$$

$$N_a = \frac{(2D/3t)^2}{(2D/3t)^2 - 1}\left[1 - \frac{1}{\sqrt{(2D/3t)^2 - 1}}\arcsin\left(\frac{\sqrt{(2D/3t)^2 - 1}}{(2D/3t)}\right)\right] \qquad \text{ii}$$

where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient wherein the element diameter D is less than 80 nm.

2. The magnetoresistive effect element according to claim 1, wherein the recording layer includes first and second magnetic layers, the first magnetic layer is made of the magnetic alloy, and the second magnetic layer is made of a magnetic alloy containing at least one element of Fe, Co, Ni, and B.

3. A magnetic random access memory comprising:
a memory cell array including a plurality of memory cells each having the magnetoresistive effect element according to claim 1 as a storing element; and
a current supply circuit which supplies a current to the memory cells.

4. A magnetoresistive effect element comprising:
a reference layer having an invariable magnetization which is perpendicular to a top surface of the reference layer;
a recording layer having a variable magnetization which is perpendicular to the top surface of the reference layer;
the top surface of the recording layer is parallel to the top surface of the reference layer; and
a nonmagnetic layer formed between the reference layer and the recording layer,
wherein the recording layer has a structure obtained by laminating at least one magnetic material layer and at least one nonmagnetic material layer, and the magnetic material layer is an alloy containing at least one element of Fe, Co, and Ni, and
the magnetoresistive effect element has an element diameter D that satisfies the following expressions i and ii:

$$D < \frac{24\mu_0}{M_s^2 N_a} \sqrt{AK_u} \qquad \text{i}$$

$$N_a = \frac{(2D/3t)^2}{(2D/3t)^2 - 1}\left[1 - \frac{1}{\sqrt{(2D/3t)^2 - 1}}\arcsin\left(\frac{\sqrt{(2D/3t)^2 - 1}}{(2D/3t)}\right)\right] \qquad \text{ii}$$

where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient wherein the element diameter D is less than 80 nm.

5. The magnetoresistive effect element according to claim 4, wherein the magnetic material layer is an alloy containing Co, Fe, and B.

6. A magnetic random access memory comprising:
a memory cell array including a plurality of memory cells each having the magnetoresistive effect element according to claim 4 as a storing element; and
a current supply circuit which supplies a current to the memory cells.

7. A magnetoresistive effect element comprising:
a reference layer having an invariable magnetization which is perpendicular to a top surface of the reference layer;
a recording layer having a variable magnetization which is perpendicular to the top surface of the reference layer;
the top surface of the recording layer is parallel to the top surface of the reference layer; and
a nonmagnetic layer formed between the reference layer and the recording layer,
wherein the recording layer is made of a magnetic alloy containing at least one element of Fe, Co, and Ni and at least one element of Pt and Pd, and
the magnetoresistive effect element has an element diameter D that satisfies the following expressions iii and iv:

$$D < \frac{6}{K_u - \frac{M_s^2}{2\mu_0}\left(N_a - \frac{1}{2}\right)} \sqrt{AK_u} \quad \text{iii}$$

$$N_a = \frac{(2D/3t)^2}{(2D/3t)^2 - 1}\left[1 - \frac{1}{\sqrt{(2D/3t)^2 - 1}} \arcsin\left(\frac{\sqrt{(2D/3t)^2 - 1}}{(2D/3t)}\right)\right] \quad \text{iv}$$

where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient wherein the element diameter D is less than 80 nm.

8. The magnetoresistive effect element according to claim 7, wherein the recording layer includes first and second magnetic layers, the first magnetic layer is made of the magnetic alloy, and the second magnetic layer is made of a magnetic alloy containing at least one element of Fe, Co, Ni, and B.

9. A magnetic random access memory comprising:
a memory cell array including a plurality of memory cells each having the magnetoresistive effect element according to claim 7 as a storing element; and
a current supply circuit which supplies a current to the memory cells.

10. A magnetoresistive effect element comprising:
a reference layer having an invariable magnetization which is perpendicular to a top surface of the reference layer;
a recording layer having a variable magnetization which is perpendicular to the top surface of the reference layer;
the top surface of the recording layer is parallel to the top surface of the reference layer; and
a nonmagnetic layer formed between the reference layer and the recording layer,
wherein the recording layer has a structure obtained by alternately laminating at least one magnetic material layer and at least one nonmagnetic material layer, and the magnetic material layer is an alloy containing at least one element of Fe, Co, and Ni, and
the magnetoresistive effect element has an element diameter D that satisfies the following expressions iii and iv:

$$D < \frac{6}{K_u - \frac{M_s^2}{2\mu_0}\left(N_a - \frac{1}{2}\right)} \sqrt{AK_u} \quad \text{iii}$$

$$N_a = \frac{(2D/3t)^2}{(2D/3t)^2 - 1}\left[1 - \frac{1}{\sqrt{(2D/3t)^2 - 1}} \arcsin\left(\frac{\sqrt{(2D/3t)^2 - 1}}{(2D/3t)}\right)\right] \quad \text{iv}$$

where Ms is a saturation magnetization of a magnetic material of the recording layer, Ku is a magnetic anisotropy constant of the magnetic material of the recording layer, A is an exchange stiffness coefficient, t is a film thickness of the recording layer, $\mu_0$ is a vacuum magnetic permeability, and Na is a demagnetization coefficient wherein the element diameter D is less thank 80 nm.

11. The magnetoresistive effect element according to claim 10, wherein the magnetic material layer is an alloy containing Co, Fe, and B.

12. A magnetic random access memory comprising:
a memory cell array including a plurality of memory cells each having the magnetoresistive effect element according to claim 10 as a storing element; and
a current supply circuit which supplies a current to the memory cells.

* * * * *